(12) United States Patent
Ren et al.

(10) Patent No.: US 10,916,433 B2
(45) Date of Patent: Feb. 9, 2021

(54) METHODS OF FORMING METAL SILICIDE LAYERS AND METAL SILICIDE LAYERS FORMED THEREFROM

(71) Applicant: Applied Materials, Inc., Santa Clara, CA (US)

(72) Inventors: He Ren, San Jose, CA (US); Maximillian Clemons, Sunnyvale, CA (US); Mei-Yee Shek, Palo Alto, CA (US); Minrui Yu, Sunnyvale, CA (US); Bencherki Mebarki, Santa Clara, CA (US); Mehul B. Naik, San Jose, CA (US); Chentsau Ying, Cupertino, CA (US); Srinivas D. Nemani, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/366,539

(22) Filed: Mar. 27, 2019

(65) Prior Publication Data
US 2019/0311908 A1 Oct. 10, 2019

Related U.S. Application Data

(60) Provisional application No. 62/653,981, filed on Apr. 6, 2018.

(51) Int. Cl.
*H01L 21/285* (2006.01)
*H01L 21/32* (2006.01)
(Continued)

(52) U.S. Cl.
CPC ...... *H01L 21/28518* (2013.01); *C23C 14/046* (2013.01); *C23C 14/0682* (2013.01);
(Continued)

(58) Field of Classification Search
CPC .................................................. H01L 21/28518
See application file for complete search history.

(56) References Cited

U.S. PATENT DOCUMENTS

| 4,424,101 A | 1/1984 | Nowicki |
| 2002/0098715 A1* | 7/2002 | Lane ................. H01L 21/28194 438/795 |

(Continued)

FOREIGN PATENT DOCUMENTS

| JP | 05-021347 A | 1/1993 |
| JP | 11-209872 A | 8/1999 |

(Continued)

OTHER PUBLICATIONS

Lin, Kevin L. et al.—"Nickel silicide for interconnects", 2015 IEEE International Interconnect Technology Conference and 2015 IEEE Materials for Advanced Metallization Conference (IITC/MAM), IEEE, (XP032808874), May 18, 2015, pp. 169-172.

(Continued)

*Primary Examiner* — Omar F Mojaddedi
(74) *Attorney, Agent, or Firm* — Patterson + Sheridan LLP

(57) ABSTRACT

Methods for forming low resistivity metal silicide interconnects using one or a combination of a physical vapor deposition (PVD) process and an anneal process are described herein. In one embodiment, a method of forming a plurality of wire interconnects includes flowing a sputtering gas into a processing volume of a processing chamber, applying a power to a target disposed in the processing volume, forming a plasma in a region proximate to the sputtering surface of the target, and depositing the metal and silicon layer on the surface of the substrate. Herein, the first target comprises a metal silicon alloy and a sputtering (Continued)

surface thereof is angled with respect to a surface of the substrate at between about 10° and about 50°.

16 Claims, 5 Drawing Sheets

(51) Int. Cl.
    *H01L 21/768* (2006.01)
    *C23C 14/04* (2006.01)
    *C23C 14/06* (2006.01)
    *C23C 14/35* (2006.01)
    *C23C 14/22* (2006.01)
    *C23C 14/58* (2006.01)
    *H01L 29/45* (2006.01)
    *H01L 21/3205* (2006.01)
    *H01L 23/532* (2006.01)

(52) U.S. Cl.
    CPC .......... *C23C 14/225* (2013.01); *C23C 14/352* (2013.01); *C23C 14/5806* (2013.01); *H01L 21/2855* (2013.01); *H01L 21/32053* (2013.01); *H01L 21/76877* (2013.01); *H01L 23/53271* (2013.01); *H01L 29/45* (2013.01)

(56) References Cited

U.S. PATENT DOCUMENTS

| | | | |
|---|---|---|---|
| 2004/0097060 A1 | 5/2004 | San et al. | |
| 2007/0095651 A1* | 5/2007 | Ye | H01L 21/67011 |
| | | | 204/192.1 |
| 2007/0254471 A1 | 11/2007 | Kameyama et al. | |
| 2007/0254477 A1 | 11/2007 | Muraoka et al. | |
| 2008/0311711 A1 | 12/2008 | Hampp et al. | |
| 2009/0283735 A1* | 11/2009 | Li | H01L 27/2409 |
| | | | 257/1 |
| 2010/0273324 A1 | 10/2010 | Lin et al. | |
| 2014/0102877 A1 | 4/2014 | Yamazaki | |
| 2015/0279635 A1 | 10/2015 | Subramani et al. | |
| 2016/0118260 A1* | 4/2016 | Mebarki | H01L 21/28556 |
| | | | 438/660 |
| 2016/0204027 A1* | 7/2016 | Lakshmanan | H01L 23/53271 |
| | | | 438/660 |
| 2016/0268127 A1 | 9/2016 | Yamazaki | |
| 2017/0053784 A1 | 2/2017 | Subramani et al. | |
| 2017/0053946 A1 | 2/2017 | Matsuzaki et al. | |
| 2017/0117379 A1* | 4/2017 | Chen | H01L 29/785 |
| 2017/0263773 A1 | 9/2017 | Yamazaki | |
| 2018/0366328 A1 | 12/2018 | Ren et al. | |

FOREIGN PATENT DOCUMENTS

| | | |
|---|---|---|
| JP | 2000357699 A | 12/2000 |
| JP | 2010168607 A | 8/2010 |
| JP | 2015067884 A | 4/2015 |
| JP | 2015086459 A | 5/2015 |
| JP | 2015115394 A | 6/2015 |
| KR | 20010046843 A | 6/2001 |
| WO | 2011002058 A | 1/2011 |
| WO | 2011002058 A1 | 1/2011 |
| WO | 2016111833 A1 | 7/2016 |

OTHER PUBLICATIONS

EPO Extended European Search Report dated Aug. 9, 2019, for European Patent Application No. 19166775.7.
Japanese Office Action dated Mar. 17, 2020, for Japanese Patent Application No. 2019-073230.
Taiwan Office Action dated Mar. 31, 2020, for Taiwan Patent Application No. 108111883.
Korean Office Action dated Aug. 4, 2020, for Korean Patent Application No. 10-2019-0040236.
Japanese Office Action dated Nov. 10, 2020, for Japanese Patent Application No. 2019-073230.

* cited by examiner

METHODS OF FORMING METAL SILICIDE LAYERS AND METAL SILICIDE LAYERS FORMED THEREFROM

CROSS-REFERENCE TO RELATED APPLICATIONS

This application claims priority to U.S. Provisional Application Ser. No. 62/653,981 filed on Apr. 6, 2018, which is herein incorporated by reference in its entirety.

BACKGROUND

Field

Embodiments described herein generally relate to the field of semiconductor device manufacturing equipment and processes, and more particularly, to methods of forming metal silicide interconnects using physical vapor deposition (PVD) and high pressure anneal processes.

Description of the Related Art

As the circuit density for next generation devices increases and transistor dimensions continue to shrink, the properties of the materials used for wire interconnects begins to dominate device performance for major performance metrics including power consumption, resistance-capacitance (RC) delay, and reliability. Copper has been used for wire interconnects in advanced USLI and VSLI technologies for the past two decades because copper generally exhibits relatively low resistivity, and thus high conductivity. However, as the widths of the interconnect wiring of a device shrink to dimensions at or below the electron mean free path (eMFP) of the interconnect wiring material, the effective resistivity of the material is increased as a result of undesirable side-wall electron scattering at the surface of the interconnect wiring and the grain boundary interfaces thereof. Thus, the effective resistivity of copper, the material conventionally used in interconnects, begins to increase for copper interconnects having a width below copper's eMFP of 39 nm and increases dramatically for interconnects having a width of 20 nm or less. In addition, barrier layers used with copper interconnects (to prevent undesirable diffusion of the copper material into surrounding dielectric material) further contribute to an increased overall resistivity of the wire interconnect. One promising replacement for copper as a wire interconnect material is nickel silicide which has comparably low resistivity and an eMFP of less than 10 nm (depending on the nickel to silicon material composition) making it a suitable material for wire interconnects having a trench critical dimension (CD) of 20 nm or less and even of 10 nm or less.

Metal silicides, such as nickel silicide, are widely used in front end of line (FEOL) semiconductor device manufacturing processes where low resistivity and thermally stable conductor materials are desired. For example, metal silicides are commonly used to form ohmic contact with source, drain, and gate device features. Unfortunately, conventional methods of forming metal silicides, such as annealing alternating layers of metal and silicon to cause the interdiffusion thereof and solid state reactions between the metal and silicon atoms, are generally incompatible with the lower thermal budget requirements of back end of line (BEOL) semiconductor device manufacturing processes, including processes for forming wire interconnects.

Accordingly, what is needed in the art are improved methods of forming metal silicides and metal silicide wire interconnects at lower temperatures.

SUMMARY

Embodiments herein relate to semiconductor device manufacturing, and more particularly, to methods of forming metal silicide interconnects using a physical vapor deposition (PVD) and high pressure anneal process sequence.

In one embodiment, a method of forming a metal and silicon layer on a substrate includes flowing a gas into a processing volume of a processing chamber, applying a power to a target disposed in the processing volume, forming a plasma in a region proximate to a sputtering surface of the target, and depositing the metal and silicon layer on a surface of a substrate. Herein, the target comprises a metal-silicon alloy and the sputtering surface thereof is angled with respect to the surface of the substrate at between about 10° and about 50°.

In another embodiment, a method of annealing a plurality of interconnect features includes pressurizing a first processing volume to a pressure more than about 1 times atmospheric pressure using a gas delivered thereinto, heating a substrate disposed in the first processing volume to an anneal temperature of not more than about 400° C., and maintaining the substrate at the anneal temperature for about 30 seconds or more. In this embodiment, the first processing volume is a processing volume of a first processing chamber and the substrate comprises a dielectric layer having a plurality of interconnect features formed therein. The plurality of interconnect features were formed using a method which included flowing a gas into a second processing volume, applying a power to a target disposed in the second processing volume, forming a plasma in a region proximate to a sputtering surface of a first target, and depositing a metal and silicon layer on the surface of the substrate and in a plurality of openings formed in the dielectric layer. In this embodiment, the second processing volume was a processing volume of a second processing chamber, the target comprised a metal-silicon alloy and the sputtering surface thereof was angled with respect to the surface of the substrate at between about 10° and about 50°.

In another embodiment, a device features a patterned substrate having a plurality of openings formed in a dielectric layer disposed thereon and a metal silicide disposed in the plurality of openings to form a corresponding plurality of interconnects.

In another embodiments a patterned substrate features a substrate, a dielectric layer disposed on the substrate, the dielectric layer having a plurality of openings formed therein, and a metal and silicon layer deposited in the plurality of openings and on a field surface of the dielectric layer, wherein the as deposited metal and silicon layer comprises a mixture of metal and silicon having an atomic composition of $M_XSi_{(1-X)}$, wherein X is between about 0.4 and about 0.6.

In another embodiment, a patterned substrate is provided. The patterned substrate includes a substrate, a dielectric layer disposed on the substrate, the dielectric layer including a plurality of openings formed therein, and a nickel and silicon layer deposited in the plurality openings and on a field surface of the dielectric layer. Herein, the as deposited nickel and silicon layer comprises a mixture of metal and silicon having an atomic composition of $Ni_XSi_{(1-X)}$, wherein X is between about 0.4 and about 0.6.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments herein relate to semiconductor device manufacturing, and more particularly, to methods of forming metal silicide interconnects using a physical vapor deposition (PVD) and high pressure anneal process sequence. In some embodiments, the process sequence includes depositing a layer of a mixture of metal and silicon on a substrate having a plurality of openings formed therein, depositing a passivation layer, such as a metal nitride layer, on the metal and silicon layer, and annealing the substrate in a high pressure atmosphere. Typically, a multi-cathode PVD chamber is used to deposit both the metal and silicon layer and the passivation layer and a high pressure anneal chamber is used to anneal the metal and silicon layer to form low resistivity metal silicide interconnects.

Using a multi-cathode, i.e., multi-sputtering target, PVD chamber to practice the methods set forth herein allows for smaller target diameters than typically used in conventional single target PVD chambers. A smaller target diameter for some target materials, such as nitrides, oxides, metal and silicon alloys, and metal silicides, beneficially reduces the chances a target formed therefrom from cracking due to uneven erosion of material from the target surface over the target's lifetime. The uneven wear of the target material induces within-target mechanical stresses that cause bending and flexing thereof during the deposition processes. This bending and flexing of the target leads to undesirable cracking. However, because the bending associated with a smaller diameter target is less than the bending associated with a larger diameter target, the smaller diameter targets used herein are desirably less prone to cracking. Further, using a multi-target PVD chamber allows for deposition of the passivation layer without exposing the substrate, and the metal and silicon layer deposited thereon, to atmospheric conditions or requiring a time consuming transfer sequence to a second processing chamber. Using a high pressure (e.g., more than the atmospheric pressure) processing chamber to anneal the metal and silicon layer enables the formation, through low temperature high pressure anneal thereof, of a crystalline phase metal silicide layer at anneal temperatures that are compatible with BEOL thermal budget requirements, herein at anneal temperatures of 400° C. or less. As used herein atmospheric pressure is about 1 bar.

Figure 1:
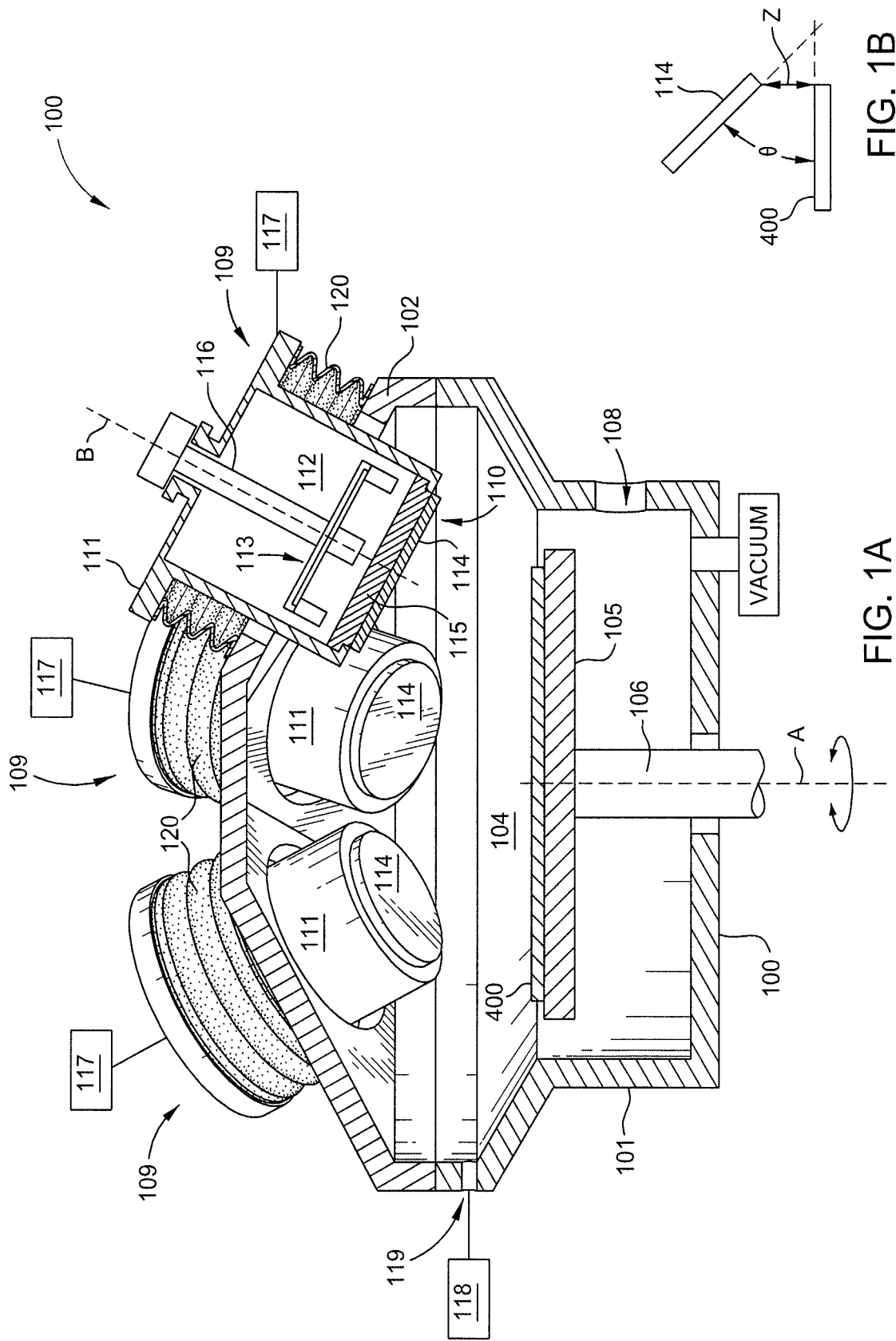
FIG. 1A is a schematic cross-sectional view of an exemplary multi-cathode physical vapor deposition (PVD) chamber used to practice the methods set forth herein, according to one embodiment.
FIG. 1B illustrates the relative positions of a target and a substrate disposed in the PVD chamber of FIG. 1A during substrate processing, according to one embodiment.

FIG. 1A is a schematic cross-sectional view of an exemplary multi-cathode physical vapor deposition (PVD) chamber used to practice the methods set forth herein, according to one embodiment. The PVD chamber 100 features one or more sidewalls 101, a chamber lid 102, and a chamber base 103 which together define a processing volume 104. The processing volume 104 is fluidly coupled to a vacuum, such as to one or more dedicated vacuum pumps, which maintain the processing volume 104 at sub-atmospheric conditions and evacuate processing and other gases therefrom.

A substrate support 105, disposed in the processing volume 104, is disposed on a movable support shaft 106 sealingly extending through the chamber base 103, such as being surrounded by a bellows (not shown) in the region below the chamber base 103. Herein, the PVD chamber 100 is conventionally configured to facilitate transferring of a substrate 400 to and from the substrate support 105 through an opening 108 in one of the one or more sidewalls 101, which is conventionally sealed with a door or a valve (not shown) during substrate processing. In some embodiments, the support shaft 106 is further coupled to an actuator (not shown) which rotates the support shaft 106, and thus the substrate 400 disposed on the substrate support 105, about an axis A during substrate processing which, under some process conditions, improves the thickness uniformity of the deposited layers on the surface of the substrate 400.

Herein, the PVD chamber 100 features a plurality of cathodes 109. One or more of the cathodes 109 features a target assembly 110 disposed in the processing volume 104, a cathode housing 111 coupled the target assembly 110 where the cathode housing 111 and the target assembly define a housing volume 112, and a magnet assembly 113 disposed in the housing volume 112. In some embodiments, the target assembly 110 includes a sputtering target 114 disposed on, and bonded to, a target backing plate 115. In other embodiments, the target assembly 110 comprises a unitary body formed of a to be sputtered target material. In some embodiments, the magnet assembly 113 is coupled to a rotatable shaft 116 which rotates the magnet assembly 113 about an axis B over the rear non-sputtering side of the target assembly 110. Each of the cathodes 109 herein is coupled to a power supply 117, such as to an RF frequency power supply, a DC power supply, or a pulsed DC power supply. In some embodiments, a cooling fluid having a relatively high resistivity is provided to the housing volume 112 by a cooling fluid source (not shown) in fluid communication therewith to cool the magnet assembly 113 and the adjacent target assembly 110.

Typically, the PVD chamber 100 includes a shield assembly (not shown) disposed in the processing volume 104 and extending between adjacent target assemblies 110 which is positioned to prevent cross-talk (undesirable electrical interference from one cathode's power supply with another cathode's power supply during a co-sputtering process) and cross-target contamination (undesirable deposition of material from one cathode's target onto another cathode's target during co-sputtering, sequential sputtering, or single sputtering processes).

Herein, each of the cathodes 109 includes a bellows 120 and an angular adjustment mechanism (not shown) coupled to the exterior of the chamber lid 102 and to the cathode housing 111. The bellows 120 is used to maintain the vacuum condition of the processing volume 104 by preventing the passage of atmospheric gases into the processing volume 104 and leakage of processing gases from the processing volume 104 to the surrounding environment while allowing angular adjustment of the cathode housing 111 with respect to the chamber body. The angular adjustment mechanism is used to alter, and then fix, the position the cathode housing 111 and thus a sputtering surface of a target 114 coupled thereto, at an angle relative to the surface of the substrate 400 which is described in further detail with reference to FIG. 1B.

FIG. 1B illustrates the relative positions of a target 114 of any one of the cathodes 109 and a substrate 400 when the substrate 400 is in a raised substrate processing position, according to one embodiment. The target 114 is spaced apart from a plane of a surface of the substrate 400 by a vertical distance Z measured from a portion of the target 114 closest to the plane of the surface of the substrate. Herein, the vertical distance Z is between about 100 mm and about 400 mm, such as between about 150 mm and about 250 mm, such as between about 200 mm and about 300 mm, for example between about 225 mm and about 275 mm. The sputtering surface of the target 114 is angled with respect to the surface of the substrate 400 at an angle θ between about 10 degrees and about 50 degrees, such as between about 20 degrees and about 40 degrees, for example between about 20 degrees and about 30 degrees or between about 30 degrees and about 40 degrees.

Typically, the substrate 400 has a diameter of 300 mm or more and the target 114 has a diameter less than the diameter of the substrate 400, such as less than 300 mm, such as 200 mm or less, or 150 mm or less, for example between about 50 mm and about 200 mm, such as between about 50 mm and about 150 mm, or about 100 mm. In some embodiments, a thickness of the target, for example a thickness of a metal-silicon alloy forming the target is between about 2 mm and about 5 mm.

Figure 2:
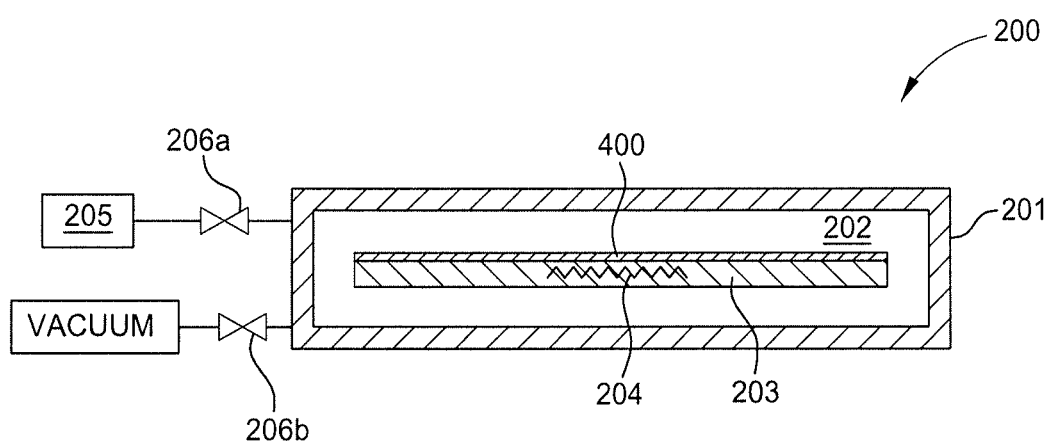
FIG. 2 is a schematic cross-sectional view of an exemplary high pressure anneal chamber used to practice the methods set forth herein, according to one embodiment.

FIG. 2 is a schematic cross-sectional view of an exemplary high pressure anneal chamber used to practice the methods set forth herein, according to one embodiment. The anneal chamber 200 features a chamber body 201 defining a processing volume 202 and a substrate support 203 disposed in the processing volume 202. Herein, the anneal chamber is a single substrate processing chamber configured to heat a substrate 400 disposed on the substrate support 203 to a desired temperature using a heat source, such as a resistive heater 204, embedded in the substrate support 203. In some embodiments, the substrate support is a hot plate. In some other embodiments, the heat source is a radiant heat source, such as a plurality of lamps positioned above, below, or both above and below the substrate 400 to radiate heat theretowards. In some other embodiments, the anneal chamber is a batch processing chamber configured to heat a plurality of substrates in a single anneal process sequence.

Herein, the processing volume 202 is fluidly coupled to a high pressure gas source 205 and to a vacuum source, such as one or more dedicated vacuum pumps or to a common fab exhaust. Herein, the high pressure gas source 205 includes one or more high pressure gas cylinders (not shown) having a pressure that is more than the desired processing pressure in the processing volume. In other embodiments, the high pressure gas source 205 includes one or more pumps (not shown) that pressurize one or more anneal gases delivered thereto. During substrate processing the processing volume 202 is desirably maintained at a pressure above atmospheric pressure, such as between about more than about 1 times and about 100 times atmospheric pressure, through operation of valves 206a and 206b fluidly coupled to the high pressure gas source 205 and the vacuum source respectively. Herein, the anneal chamber 200 is capable of heating and maintaining the substrate to temperatures up to 800° C., typically between 200° C. and 800° C. Herein, the anneal chamber 200 is a standalone chamber or one of a plurality of connected chambers that is not coupled to the multi-cathode PVD chamber 100 described in FIG. 1A. In other embodiments (not shown), the anneal chamber 200 and the PVD chamber 100 are part of a multi-chamber (i.e., cluster tool) processing system and are coupled by transfer chamber which allows for transfer of a substrate from the PVD chamber 100 to the anneal chamber 200 without exposing the substrate to atmospheric conditions.

Figure 3A:
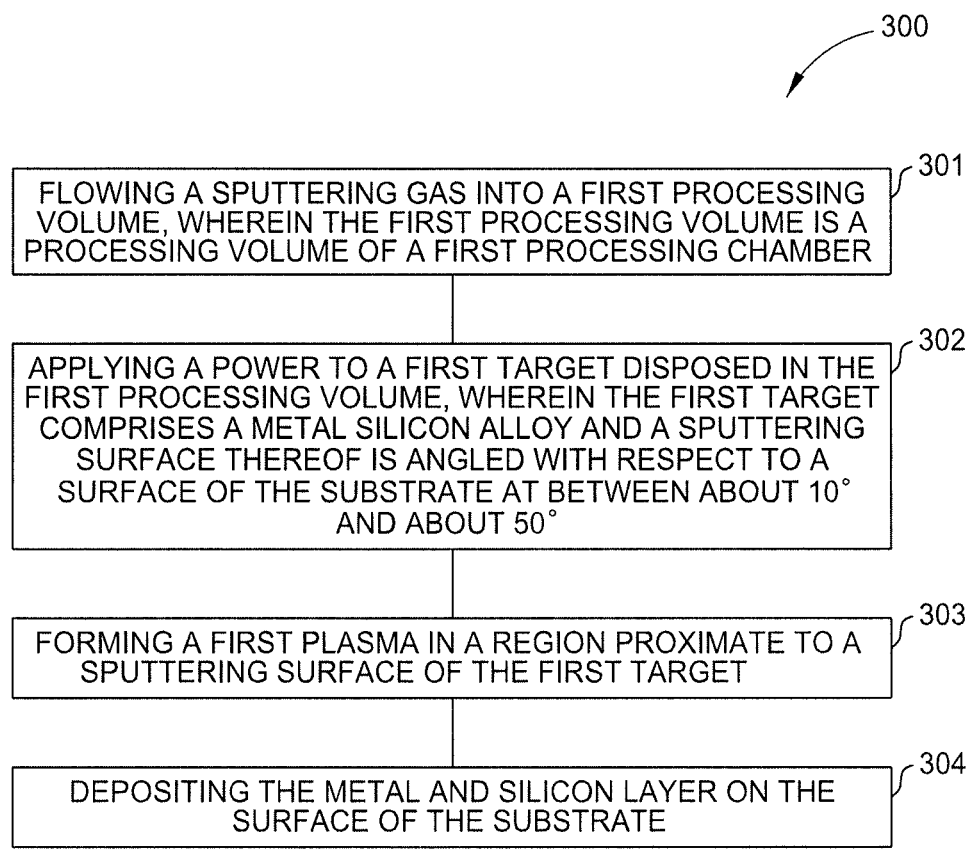
FIG. 3A is a flow diagram of a method of forming a metal and silicon layer on a substrate, according to one embodiment.
Figure 3B:
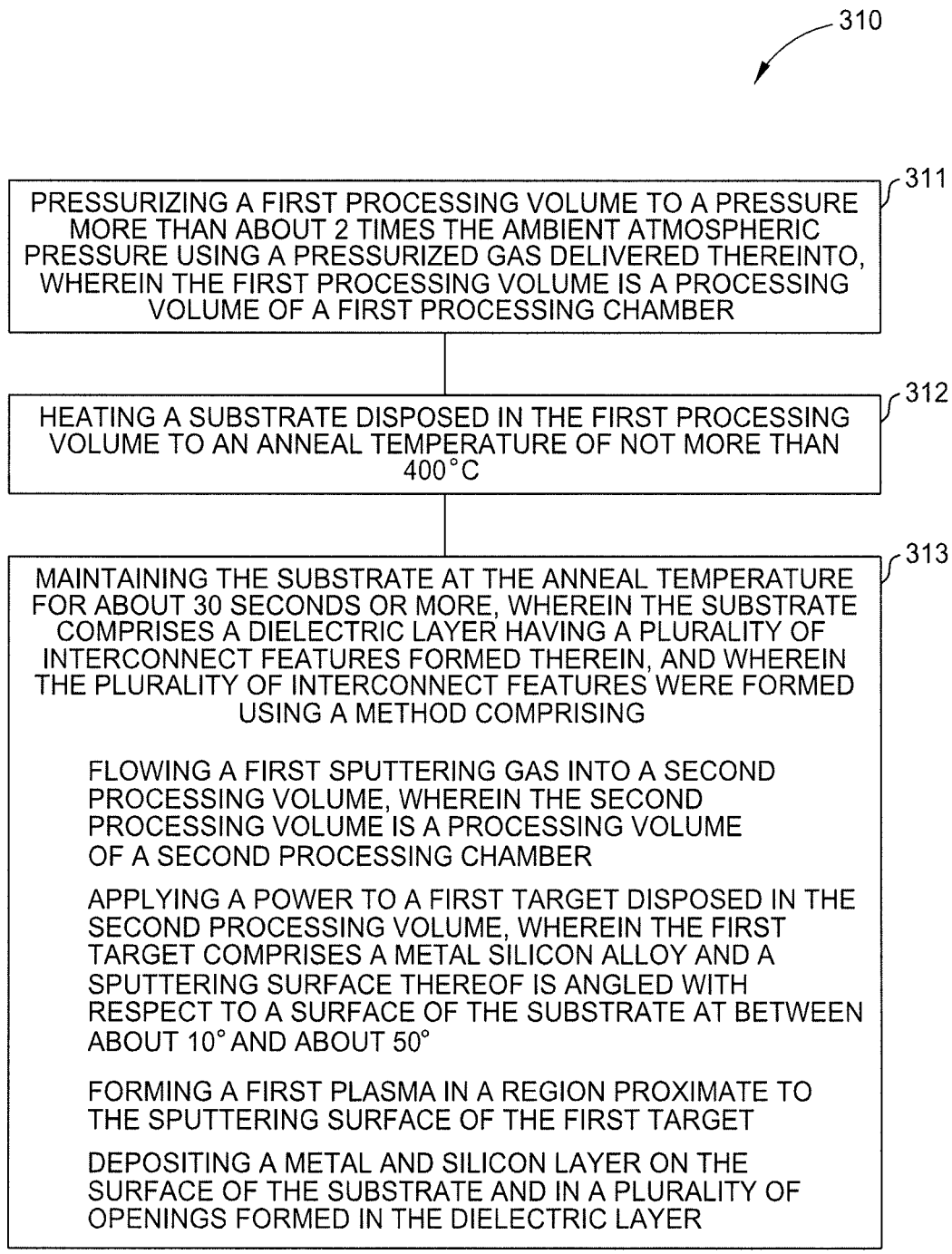
FIG. 3B is a flow diagram of a method of annealing a plurality of interconnect features, according to one embodiment.

FIG. 3A is a flow diagram of a method of forming a metal and silicon layer on a substrate, according to one embodiment. FIG. 3B is a flow diagram of a method of annealing a metal and silicon layer to form low resistivity metal silicide wire interconnects, according to one embodiment. FIGS. 4A-4D illustrate forming metal silicide interconnects using the combined methods set forth in FIGS. 3A-3B, according to one embodiment At activity 301 the method 300 includes flowing a sputtering gas into a processing volume, herein a first processing volume, which is a processing volume of a first processing chamber, such as the processing volume of the multi-cathode PVD chamber described in FIG. 1A. Typically, the sputtering gas comprises an inert gas, for example Ar, He, Ne, Kr, Xe, or a combination thereof. In some embodiments, the first processing volume is desirably maintained at a pressure less than about 10 mTorr, such as less than about 5 mTorr, such as less than about 1 mTorr, for example between about 0.5 mTorr and about 1 mTorr during the deposition process.

At activity 302 the method 300 includes applying a power to a first target disposed in the first processing volume. Here, the first target comprises a metal-silicon alloy, for example TiSi, NiSi, PtSi, or CoSi. In some embodiments, the first target comprises an amorphous nickel-silicon alloy having an atomic composition of $Ni_xSi_{(1-X)}$ where X is between about 0.4 and about 0.6, for example about 0.5. Herein, the first target is bonded to a backing plate, e.g., a copper backing plate. In some embodiments, the first target is desirably maintained at a temperature between about 15° C. and about 30° C. during the deposition process.

In some embodiments, the first target further comprises carbon, for example TiSiC. In other embodiments, the first target comprises a metal-metal-silicon alloy or a metal-metal-carbon alloy, for example TiAlSi or TiAlC. In embodiments herein, a sputtering surface of the first target is angled with respect to a surface of the substrate at between about 10° and about 50°, such as between about 20° and about 40°. In some embodiments, a diameter of the first target is less than a diameter of the substrate, such as in embodiments where a diameter of the substrate is 300 mm or more. In some embodiments, the diameter of the first target is between about 50 mm and about 200 mm, or example about 200 mm or less, such as about 150 mm or less. Typically, depending on the chamber configuration material sputtered from the first target may cover between about 60% and about 80% of the substrate surface. Therefore, in some embodiments, the method further includes rotating the substrate during the deposition process.

Typically, the power applied to the first target is delivered from an RF frequency (or other ac frequency) power source, a DC power source, or a pulsed DC power source. Herein, the power source is coupled to the first target, to a backing plate having the first target bonded thereto, and thus electrically coupled thereto. Typically, when used, an RF power applied to the target is between about 100 watts and about 1000 watts or a DC power applied to the target is between about 600 watts and about 1200 watts. In some embodiments, a pulsed DC power applied to the target has a pulse frequency of between about 25 kHz and about 250 kHz and an on-time duty cycle of between about 10% and about 90%.

At activity 303 the method 300 includes forming a first plasma in a region proximate to the sputtering surface of the first target.

Figure 4A:
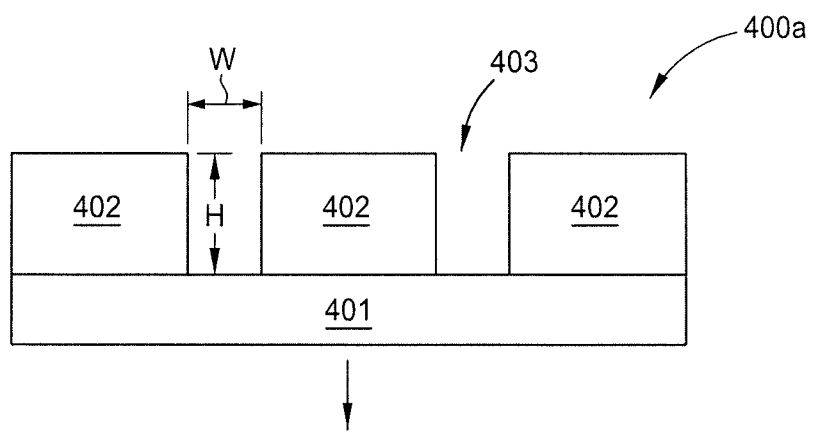
FIGS. 4A-4D illustrate forming a metal silicide interconnect using the combined methods set forth in FIGS. 3A-3B, according to one embodiment

At activity 304 the method 300 includes depositing the metal and silicon layer on the surface of the substrate, such the patterned substrate 400 illustrated in FIG. 4A. In some embodiments, the method 300 further includes rotating the substrate while depositing the metal and silicon layer on the surface thereof.

Figure 4B:
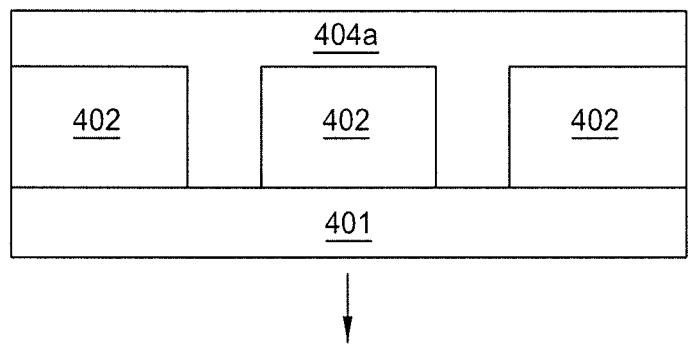
Figure 4C:
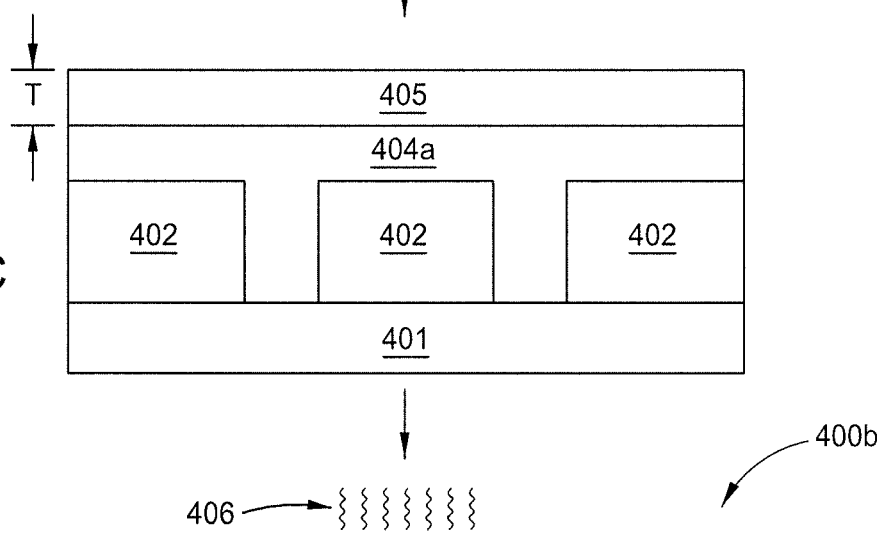

In some embodiments, the method 300 further includes depositing a passivation layer, such as the passivation layer 405 shown in FIG. 4C, on the metal and silicon layer. Examples of passivation layers include metal-nitride layers or metal-oxide layers where the metal is one or Al, Cr, Zn, Ti, or a combination thereof or silicon oxide or nitride layers. In some embodiments, the passivation layer 405 is deposited in the same multi-cathode PVD chamber used to deposit the metal and silicon layer 404a, and thus is deposited without the substrate breaking vacuum. In some embodiments, the passivation layer 405 comprises TiN deposited in the same processing chamber as the metal and silicon layer, and thus without the substrate breaking vacuum. In some embodiments, the target comprises TiN and the sputtering gas comprises an inert gas, for example Ar, He, Ne, Kr, Xe, or a combination thereof. Using a TiN target and an inert sputtering gas depositing a TiN passivation layer desirably avoids exposing the substrate, having the metal and silicon layer deposited thereon, to a plasma formed of a nitrogen source gas typically used to form TiN layers which could potentially damage the previously deposited nickel and silicon layer, e.g., buy forming undesirable silicon nitride therein. Therefore, in some embodiments, the sputtering gas used to deposit the TiN layer is nitrogen free meaning that the gases used to form the sputtering gas do not have a nitrogen moiety.

In other embodiments, the TiN layer is deposited by flowing a sputtering gas comprising an inert gas and a nitrogen containing gas, such as $N_2$, $NH_3$ or combinations thereof, into the processing chamber, applying an RF power to a second target, herein a titanium target, forming a plasma of the sputtering gas in front of the sputtering surface of the second target, and depositing a TiN layer onto the metal and silicon layer. In some embodiments, the passivation layer has a thickness T of about 5 nm or more, such as about 10 nm or more, or about 15 nm or more. Typically, the second target is angled with respect to the surface of the substrate support, and thus an active surface of the substrate positioned thereon, at between about 10° and about 50°, such as between about 20° and about 40°.

FIG. 3B is a flow diagram of a method of annealing a metal and silicon layer to form low resistivity metal silicide wire interconnects, according to one embodiment. At activity 311 the method 310 includes pressurizing a first processing volume to a desired pressure of more than about 1 times the atmospheric pressure, for example between about 1 times and about 10 times the atmospheric pressure, such as more than about 2 times, more than about 3 times, more than about 4 times, or more than about 5 times the atmospheric pressure. Here, the first processing volume is a processing volume of a first processing chamber, such as the high pressure anneal chamber 200 described in FIG. 2. Typically, the first volume is pressurized by delivering a high pressure gas thereinto. Examples of high pressure gases, e.g., annealing gases, used herein include Ar, He, forming gas (mixture of $H_2$ and $N_2$), $N_2$, $O_2$, CO, $CO_2$, and combinations thereof. In some embodiments, the annealing gas is one or a combination of Ar, He, or $N_2$. Herein, the first processing volume is maintained at the desired pressure through the duration of activities 312 and 313, or at least through the duration of activity 313.

At activity 312 the method 310 includes heating a substrate to an anneal temperature of not more than about 400° C. In some embodiments, the anneal temperature is not more than about 350° C., or is between about 300° C. and about 400° C., for example between about 300° C. and about 350° C. In other embodiments, the substrate is heated to the anneal temperature before the first processing volume is pressurized at activity 311.

At activity 313 the method 310 includes maintaining the substrate at the anneal temperature for about 30 seconds or more, such as between about 30 seconds and about 3 hours, such as between about 30 seconds and about 60 minutes, between about 30 seconds and about 10 minutes, for example between about 30 seconds and about 5 minutes, to form a metal silicide layer 404b.

Figure 4D:
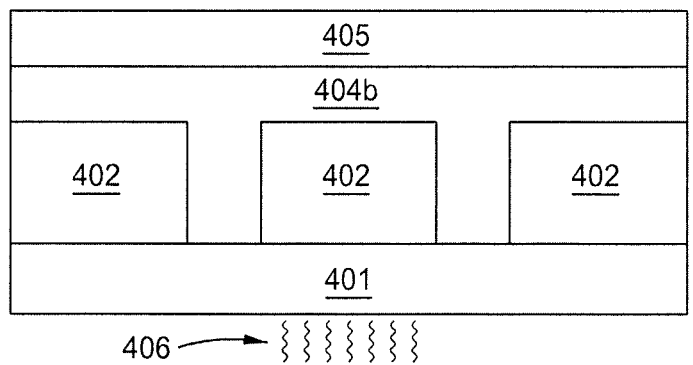

In some embodiments, the substrate is a patterned substrate, such as the patterned substrate 400b shown in FIG. 4D comprising a dielectric layer 402 having a plurality of openings formed therein, such as the openings 403 shown in FIG. 4A, and a metal and silicon layer 404a disposed in the openings to form a plurality of interconnect features, e.g., wire interconnects.

Herein, the plurality of interconnect features were formed using a method which included flowing a first sputtering gas into a second processing volume, such as the processing volume of the multi-cathode PVD chamber 100 described in FIG. 1A, applying a power to a first target disposed in the second processing volume, forming a first plasma in a region proximate to the sputtering surface of the first target, and depositing a metal and silicon layer on the surface of the substrate and in a plurality of openings formed in the dielectric layer.

Further embodiments of the method 310 include any of the embodiments set forth in the method 300 described in FIG. 3A. In some embodiments, one or both of the methods 300 and 310 are used to form a plurality of nickel monosilicide interconnects having a width of less than about 20 nm, a height of 2 times width or more, and a resistivity of less than about 30 ohm-cm, such as between about 10 ohm-cm and about 30 ohm-cm.

The methods 300 and 310 described above beneficially allow for the formation of low resistivity crystalline metal silicide interconnects, such as nickel monosilicide interconnects suitable for use in the sub 20 nm regime, using processing temperatures compatible with back end of line (BOEL) thermal budget requirements.

FIG. 4A illustrates an exemplary patterned substrate 400a, according to one embodiment. Herein, the patterned substrate 400a includes a substrate 401 formed of a semiconductor material, such as silicon, having a dielectric layer 402 disposed thereon. Typically, the dielectric layer 402 is formed of nitride, carbide, or low-k polymer materials, such as $SiO_2$, SiN, SiOC, SiC, a polyamide, or combinations thereof and has a plurality of openings 403 formed therein. In some embodiments, a width W of each of the openings 403 is less than about 20 nm, such as less than about 15 nm, less than about 10 nm, less than about 8 nm, less than about 7 nm, for example less than about 5 nm. Typically, a height H of each of the openings 403 is equal to or more than about 2 times the width W.

Here, the patterned substrate 400a does not include a barrier layer (a layer of material that prevents undesirable diffusion of some interconnect materials, e.g., copper, into the dielectric layer 402). In other embodiments, the patterned substrate 400a further includes a barrier layer (not shown), such as a layer of Ta, TaN, It, W, WN, or combinations thereof, disposed on the dielectric layer 402 and serving as a liner in the openings 403. In some embodiments, a barrier layer is deposited in the same processing chamber as is the subsequently deposited metal and silicon layer, and thus without the substrate breaking vacuum between the deposition of the barrier layer and the to be deposited metal and silicon layer.

FIG. 4B illustrates a metal and silicon layer 404a, such as a nickel and silicon layer, deposited on the patterned substrate 400a shown in FIG. 4A using the method 300. Typically, the as deposited metal and silicon layer 404a comprises a mixture, for example a homogenous mixture, of metal and silicon having a substantially uniform stoichiometry. A substantially uniform stoichiometry herein at least means that the atomic ratio of metal to silicon in the mixture varies less than 5% when measured at locations both across the surface of the metal and silicon layer 404a or at locations within the metal and silicon layer 404a such as locations proximate to surface of the dielectric layer 402, distal from surfaces of the dielectric layer 402, and at locations therebetween. In some embodiments, the stoichiometry of the mixture of metal and silicon varies less than about 4%, such as less than 3%, less than 2%, for example less than 1%.

In some embodiments, the as deposited metal and silicon layer 404a comprises an amorphous nickel-silicon alloy having substantially uniform stoichiometry of $Ni_xSi_{(1-X)}$, where X is between about 0.4 and about 0.6, for example about 0.5. In some embodiments, the as deposited metal and silicon layer 404a comprises a combination of amorphous nickel-silicon alloy and crystalline nickel silicide, the combination having a substantially uniform stoichiometry of $Ni_xSi_{(1-X)}$, where X is between about 0.4 and about 0.6, for example about 0.5. In some embodiments, the as deposited metal and silicon layer 404a comprises an unsaturated and thermally unstable mixture of metal and silicon. Therefore, embodiments herein provide for low temperature high pressure anneal of the as deposited metal and silicon layer 404a to form crystalline phase metal silicide through solid state reaction. Low temperature high pressure anneal of the as deposited metal and silicon layer 404a ensures complete saturation of otherwise dangling silicon bonds to provide a thermally stable crystalline phase metal silicide, such as crystalline nickel monosilicide (NiSi), suitable for use as low resistivity wire interconnects in a semiconductor device. Herein, low resistivity at least means that the sheet resistance of a metal silicide layer is less than about 60 μohm-cm, such as less than about 50 μohm-cm, less than about 40 μohm-cm, for example less than about 30 μohm-cm.

While the foregoing is directed to embodiments of the present disclosure, other and further embodiments of the disclosure may be devised without departing from the basic scope thereof, and the scope thereof is determined by the claims that follow.

The invention claimed is:

1. A method of processing a substrate, comprising:
   forming a metal and silicon layer on a surface of the substrate having a plurality of openings formed therein, comprising:
   flowing a sputtering gas into a first processing volume, wherein the first processing volume is a processing volume of a first processing chamber;
   applying a power to a target disposed in the first processing volume, wherein the target comprises a metal-silicon alloy and a sputtering surface thereof is angled with respect to the surface of the substrate at between about 10° and about 50°;
   forming a plasma in a region proximate to the sputtering surface of the target; and
   depositing the metal and silicon layer on the surface of the substrate to fill the plurality of openings to at least a level of the surface; and
   annealing the metal and silicon layer in a second processing volume, wherein the second processing volume is a processing volume of a second processing chamber, and wherein annealing the metal and silicon layer comprises:
   pressurizing the second processing volume to a pressure of more than about 1 times atmospheric pressure using a pressurized gas delivered thereinto;
   heating the substrate to an anneal temperature of not more than about 400° C.; and
   maintaining the substrate at the anneal temperature for about 30 seconds or more.

2. The method of claim 1, further comprising:
   transferring the substrate from the first processing volume to the second processing volume using a transfer chamber that connects the first processing chamber to the second processing chamber.

3. The method of claim 1, wherein the metal of the metal-silicon alloy is Ti, Ni, Pt, Co, or a combination thereof.

4. The method of claim 3, wherein the metal-silicon alloy is an amorphous nickel-silicon alloy having an atomic composition of $Ni_xSi_{(1-x)}$, and wherein X is between about 0.4 and about 0.6.

5. The method of claim 4, wherein the substrate comprises a dielectric layer having the plurality of openings formed therein, and wherein the annealed metal and silicon layer forms a plurality of NiSi interconnects in the plurality of openings.

6. The method of claim 5, wherein a diameter of the first target is about 200 mm or less.

7. The method of claim 5, further comprising depositing a passivation layer on the metal and silicon layer, the passivation layer comprising one of metal oxide, metal nitride, silicon oxide, silicon nitride, or a combination thereof.

8. The method of claim 5, wherein the plurality of NiSi interconnects have a resistivity of about 200 μohm-cm or less.

9. A method of processing a substrate, comprising:
   depositing an amorphous metal-silicon alloy layer on a surface of the substrate, the substrate comprising a dielectric layer having a plurality of openings formed therein, comprising:
   flowing a sputtering gas into a first processing volume of a first processing chamber;

applying a power to a target disposed in the first processing volume, wherein the target comprises a metal-silicon alloy forming a plasma in a region proximate to a sputtering surface of the target; and depositing the amorphous metal-silicon alloy layer to fill the plurality of openings to at least a level of the surface of the dielectric layer; and annealing the substrate, comprising:

positioning the substrate in a second processing volume of a second processing chamber, pressurizing the second processing volume to a pressure between about 1 times and about 10 times atmospheric pressure using a pressurized gas delivered thereinto;

heating the substrate to an anneal temperature of not more than about 400° C.; and maintaining the substrate at the anneal temperature for about 30 seconds or more.

10. The method of claim 9, wherein the amorphous metal-silicon alloy has layer an atomic composition of $M_xSi_{(1-x)}$, wherein X is between about 0.4 and about 0.6.

11. The method of claim 9, wherein annealing the substrate transforms the amorphous metal-silicon alloy layer to a crystalline metal-silicide layer having a substantially uniform stoichiometry.

12. The method of claim 11, wherein the metal of the metal-silicon alloy layer comprises Ni.

13. The method of claim 11, wherein the metal of the metal-silicide layer comprises Ti, Ni, Pt, Co, or a combination thereof.

14. The method of claim 9, further comprising depositing a passivation layer on the amorphous metal-silicon alloy layer, the passivation layer comprising one of metal oxide, metal nitride, silicon oxide, silicon nitride, or a combination thereof.

15. A method of forming nickel-silicide interconnects, comprising:

depositing a nickel and silicon alloy layer on a surface of a substrate, the substrate comprising a dielectric layer having a plurality of openings formed therein, comprising:

flowing a sputtering gas into a first processing volume of a first processing chamber;

applying a power to a target disposed in the first processing volume, wherein the target comprises a metal-silicon alloy forming a plasma in a region proximate to a sputtering surface of the target; and depositing the nickel and silicon alloy layer to fill the plurality of openings to at least a level of the surface of the dielectric layer, wherein the nickel and silicon layer comprises an amorphous nickel-silicon alloy having an atomic composition of $N_xSi_{(1-x)}$, and wherein X is between about 0.4 and about 0.6; and positioning the substrate in a second processing volume of a second processing chamber;

pressurizing the second processing volume to a pressure between about 1 times and about 10 times atmospheric pressure using a pressurized gas delivered thereinto;

heating the substrate to an anneal temperature of not more than about 400° C.; and maintaining the substrate at the anneal temperature for about 30 seconds or more.

16. The method of claim 15, wherein annealing the substrate forms a crystalline nickel-silicide layer having a substantially uniform stoichiometry.

* * * * *

UNITED STATES PATENT AND TRADEMARK OFFICE
CERTIFICATE OF CORRECTION

PATENT NO. : 10,916,433 B2
APPLICATION NO. : 16/366539
DATED : February 9, 2021
INVENTOR(S) : He Ren et al.

Page 1 of 1

It is certified that error appears in the above-identified patent and that said Letters Patent is hereby corrected as shown below:

On the Title Page

In item (57), in Column 2, in "Abstract", Line 11, delete "metal silicon" and insert -- metal-silicon --, therefor.

In the Specification

In Column 1, Line 31, delete "USLI" and insert -- ULSI --, therefor.

In Column 1, Line 31, delete "VSLI" and insert -- VLSI --, therefor.

In Column 3, Line 33, after "embodiment" insert -- . --.

In Column 6, Line 29, after "embodiment" insert -- . --.

In Column 8, Line 64, delete "(BOEL)" and insert -- (BEOL) --, therefor.

In the Claims

In Column 10, Line 51, in Claim 6, after "the" delete "first".

In Column 11, Line 23, in Claim 10, delete "$M_xSi_{(1-x)}$," and insert -- $Mi_XSi_{(1-X)}$, --, therefor.

In Column 12, Line 20, in Claim 15, delete "$N_xSi_{(1-x)}$," and insert -- $Ni_XSi_{(1-X)}$, --, therefor.

Signed and Sealed this
Twentieth Day of April, 2021

Drew Hirshfeld
*Performing the Functions and Duties of the*
*Under Secretary of Commerce for Intellectual Property and*
*Director of the United States Patent and Trademark Office*